(12) United States Patent
Weintraub et al.

(10) Patent No.: US 6,445,760 B1
(45) Date of Patent: Sep. 3, 2002

(54) PARTIALLY-SYNCHRONOUS HIGH-SPEED COUNTER CIRCUITS

(75) Inventors: Sharon Lynn Weintraub, Encinitas; Mark Chien-Fu Lin, San Diego, both of CA (US)

(73) Assignee: Applied Micro Circuits Corporation, San Diego, CA (US)

(*) Notice: Subject to any disclaimer, the term of this patent is extended or adjusted under 35 U.S.C. 154(b) by 0 days.

(21) Appl. No.: 09/616,125

(22) Filed: Jul. 14, 2000

(51) Int. Cl.[7] .................................................. H03K 21/00
(52) U.S. Cl. ........................................ 377/48; 377/118
(58) Field of Search ............................. 377/47, 48, 115, 377/117, 118, 119

(56) References Cited

U.S. PATENT DOCUMENTS

| | | | |
|---|---|---|---|
| 4,633,194 A | * 12/1986 | Kikuchi et al. ................ 377/47 |
| 4,935,944 A | 6/1990 | Everett et al. ................. 377/48 |
| 4,942,595 A | 7/1990 | Baca ............................ 377/48 |
| 5,349,622 A | * 9/1994 | Gorisse ........................ 377/48 |
| 5,425,074 A | 6/1995 | Wong ........................... 377/47 |
| 5,457,722 A | * 10/1995 | Chahabadi .................... 377/47 |
| 5,499,280 A | 3/1996 | Wilson et al. ............... 377/108 |
| 5,614,869 A | * 3/1997 | Bland ........................... 377/48 |
| 5,748,949 A | 5/1998 | Johnston ...................... 395/557 |
| 5,757,871 A | 5/1998 | Furukawa et al. ........... 375/372 |
| 5,808,691 A | 9/1998 | Malcolm, Jr. et al. ....... 348/537 |
| 6,018,258 A | * 1/2000 | Kang ........................... 327/115 |
| 6,052,152 A | 4/2000 | Malcolm, Jr. et al. ....... 348/537 |
| 6,061,418 A | * 5/2000 | Hassoun ....................... 377/47 |

* cited by examiner

Primary Examiner—Tuan T. Lam
(74) Attorney, Agent, or Firm—Gray Cary Ware & Freidenrich

(57) ABSTRACT

Partially-synchronous and non-integer integrated circuit counters for dividing a high-speed reference clock signal with a selectable divisor have been provided. The circuits use a high-speed synchronous counter that cycles between the use of a selectable and a fixed divisor, to give the counter circuit a selectable overall division ratio. The partially-synchronous counter circuit uses asynchronous dividers to complete the division process and to minimize power consumption. A non-integer counter circuit is provided that includes a edge select mechanism to reduce power consumption in the division process. Examples are presented with specific number of stages, and corresponding divisors and divisor ranges. Method for implementing the above-mentioned partially-synchronous and non-integer counter circuits have also been provided.

31 Claims, 12 Drawing Sheets

PARTIALLY-SYNCHRONOUS HIGH-SPEED COUNTER CIRCUITS

BACKGROUND OF THE INVENTION

1. Field of the Invention

This invention relates generally to the field of digital clock generation and, more particularly, to a high-speed counter circuit with a partially-synchronous operation which conserves power.

2. Description of the Related Art

Synchronously clocked logic operations are considered by many to be the preferred method of processing high-speed precision signals. As used herein, synchronous counters are defined as circuits that are clocked with a high speed reference clock that is at least as fast as the signal being processed. In a multi-stage divider, the original input signal whose frequency is being divided can be used as the reference clock, for example. Thus, synchronous circuitry operates at relatively high speeds, and relatively large amounts of power are required to process signals with precision (without large propagation delays) at high speeds. Further, conventional synchronous processing requires additional support circuitry. In a counter, for example, gates must be added between each flip-flop to synchronously compare the outputs of each stage of division. The circuitry needed to support the flip-flop dividers also uses power.

Asynchronous processing, such as counters used in the division of an input signal, are also operated with respect to a reference clock which is the output signal of previous stages. Thus, the overall speed of operation is reduced at every stage of division. Lower operation speeds typically mean that propagation delays are less of a concern and the parts can be operated at lower power levels It would be advantageous if precision, high-speed, circuits could be designed with at least some asynchronous components to reduce the amount of power consumed.

It would be advantageous if precision, high-speed, circuits could be devised that combined the use of synchronous and asynchronous components to use less power than a conventional synchronous counter.

It would be advantageous if precision, high-speed, circuits could be devised to reduce power consumption even when synchronous design principles are adhered to. To that end, it would be advantageous if a non-integer synchronous counter could be desired which operated at lower power consumption levels.

SUMMARY OF THE INVENTION

Accordingly, an integrated circuit partially-synchronous counter is provided comprising synchronous and asynchronous counters, as well a load circuit to manage the cooperation between the two counter sections. A high-speed counter section accepts a reference clock signal, divisor commands, and a load pulse. The high-speed counter synchronously divides the reference clock signal, in response to the load pulse, with a selectable divisor responsive to divisor commands. A low-speed counter section asynchronously divides the high-speed counter signal by a fixed value to provide low-speed counter signals.

The load circuit supplies a load pulse that is responsive to the low-speed counter signal, high-speed counter signals, and the reference clock signals. The load pulse is used to periodically reinitialize the high-speed counter. Upon reinitialization, the values of the divisor commands are loaded and used to offset the high-speed counter signals, which in effect causes the reference clock signals to be divided by the first divisor. Following a predetermined number of division cycles by the selectable first divisor, the reference clock signal is divided a predetermined number of division cycles by a second fixed, or default divisor.

An integrated circuit non-integer counter with selectable divisor is provided for higher edge stability requirements. While completely synchronous, this circuit includes features that significantly reduce power consumption. The non-integer counter uses a high-speed counter, as described above. A load circuit uses only the high-speed counter signal and reference clock signal as inputs, to syncronize the high-speed counter signals.

A generator accepts the load pulse, the reference clock signal, and control signals. Generator outputs provides divisor commands responsive to the control signals, and a generator count signal that is a synchronously divided quotient of the load pulse. As in the partially-synchronous counter, the load pulse initializes the high-speed counter section with divisor commands to enable a selectable first divisor. The overall division ratio of the counter is created by combining division cycles of the first and second divisor.

A partially-synchronous method for dividing a reference clock is also provided that comprises: accepting a reference clock signal; accepting divisor commands to select a first divisor; synchronously dividing the reference clock signal with either the first, or a second divisor; in response to synchronously dividing the reference clock signal, supplying high-speed counter signals; asynchronously dividing the high-speed counter signals; in response to asynchronously dividing the high-speed counter signal, supplying a low-speed counter signal; in response to the high-speed and low-speed counter signals, initializing the high-speed counter signals; and, in response to initializing the high-speed counter signals, accepting the divisor commands.

A non-integer method for dividing a reference clock with a selectable divisor is provided that comprises: accepting a reference clock signal; accepting control signals to select a first divisor; synchronously dividing the reference clock signal with either the first, or a second divisor; in response to synchronously dividing the reference clock signal, supplying high-speed counter signals; in response to high-speed counter signals and the reference clock signals, supplying a load pulse; dividing the load pulse to supply a divide-by-two signal; selecting a divide-by-two signal edge; in response to the divide-by-two edge selection and the control signals, generating a generator count signal; in response to the generator count signal and the control signals, initializing the high-speed counter signals; and, in response to initializing the high-speed counter signals, supplying the divisor commands.

DETAILED DESCRIPTION OF THE PREFERRED EMBODIMENTS

Figure 1:
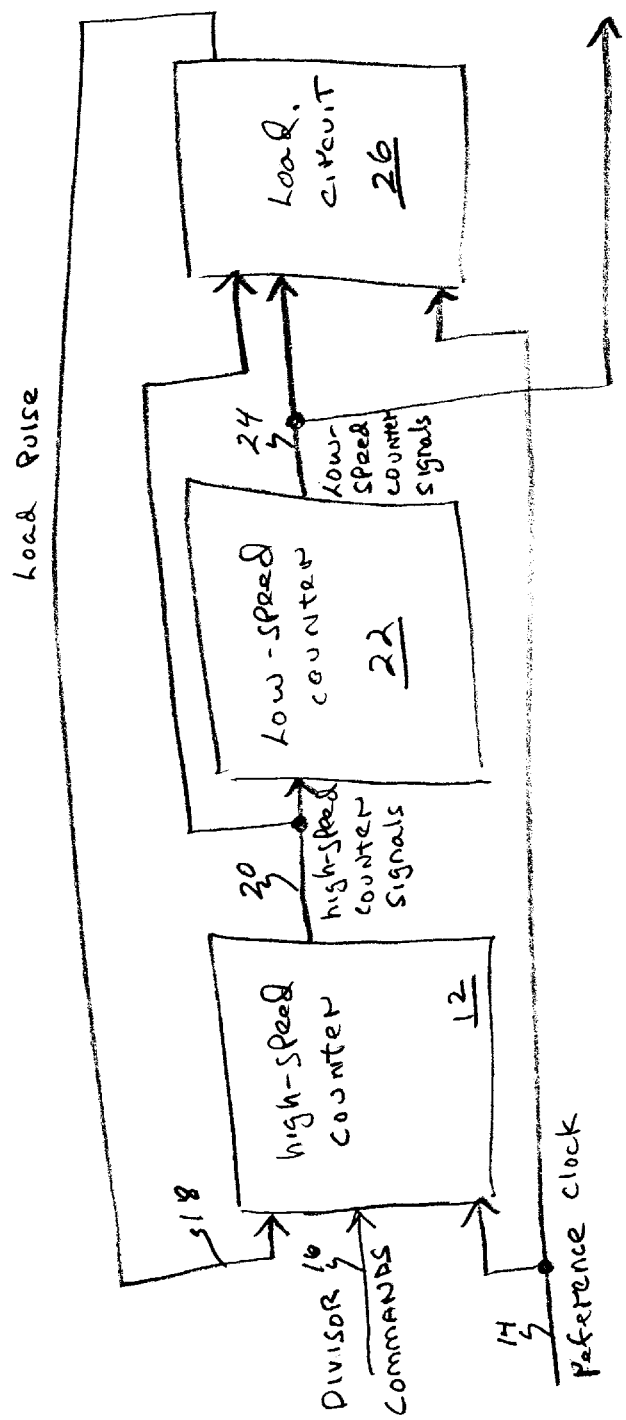
FIG. 1 is a schematic block diagram of the present invention partially-synchronous high-speed counter with selectable divisor.

FIG. 1 is a schematic block diagram of the present invention high-speed partially-synchronous counter with selectable divisor. Preferably, the counter 10 is fabricated as part of an integrated circuit (IC). To illustrate the invention, the counter 10 has been configured as a divide-by 14 to 17 counter, which is described in detail below. However, the invention is not limited to any particular divisor, or range of divisors. A high-speed counter section 12 has a first input on line 14 to accept a reference clock signal, a second input on line 16 to accept divisor commands, and a third input on line 18 to accept a load pulse. The high-speed counter 12 synchronously divides the reference clock signal on line 14 in response to the load pulse with a selectable first divisor that is responsive to divisor commands. The high-speed counter 12 divides the reference clock signal on line 14 by an integer value selected from the group of odd and even integers. The high-speed counter 12 provides high-speed counter signals at an output on line 20. When the high-speed counter 12 is not using the first divisor for division, a second, fixed value, divisor is used. The high-speed counter 12 processes the division as a series of division cycles. That is, the first divisor is used a first number of division cycles, and the second divisor is used a second number of division cycles. Thus, the overall division involves the selection of the first divisor, as well as the selection of the number of division cycles in which the first divisor is to be used. As a default, the second divisor is used.

A low-speed counter section 22 has an input connected to the output of the high-speed counter 12 on line 20 to accept the high-speed counter signal. The low-speed counter 22 asynchronously divides the high-speed counter signal by a fixed value to provide low-speed counter signals at an output on line 24.

A load circuit 26 has a first input connected to the low-speed counter output on line 24 to accept the low-speed counter signals, a second input connected to the high-speed counter output on line 20 to accept the high-speed counter signals, and a third input on line 14 to accept the reference clock signal. The reference clock is used for sycnronizing the high-speed counter signals to the reference clock signal. The load circuit 26 has an output connected to the third input of the high-speed counter on line 18 to provide a load pulse that is responsive to the low-speed counter signals and the syncronized high-speed counter signals.

Figure 2:
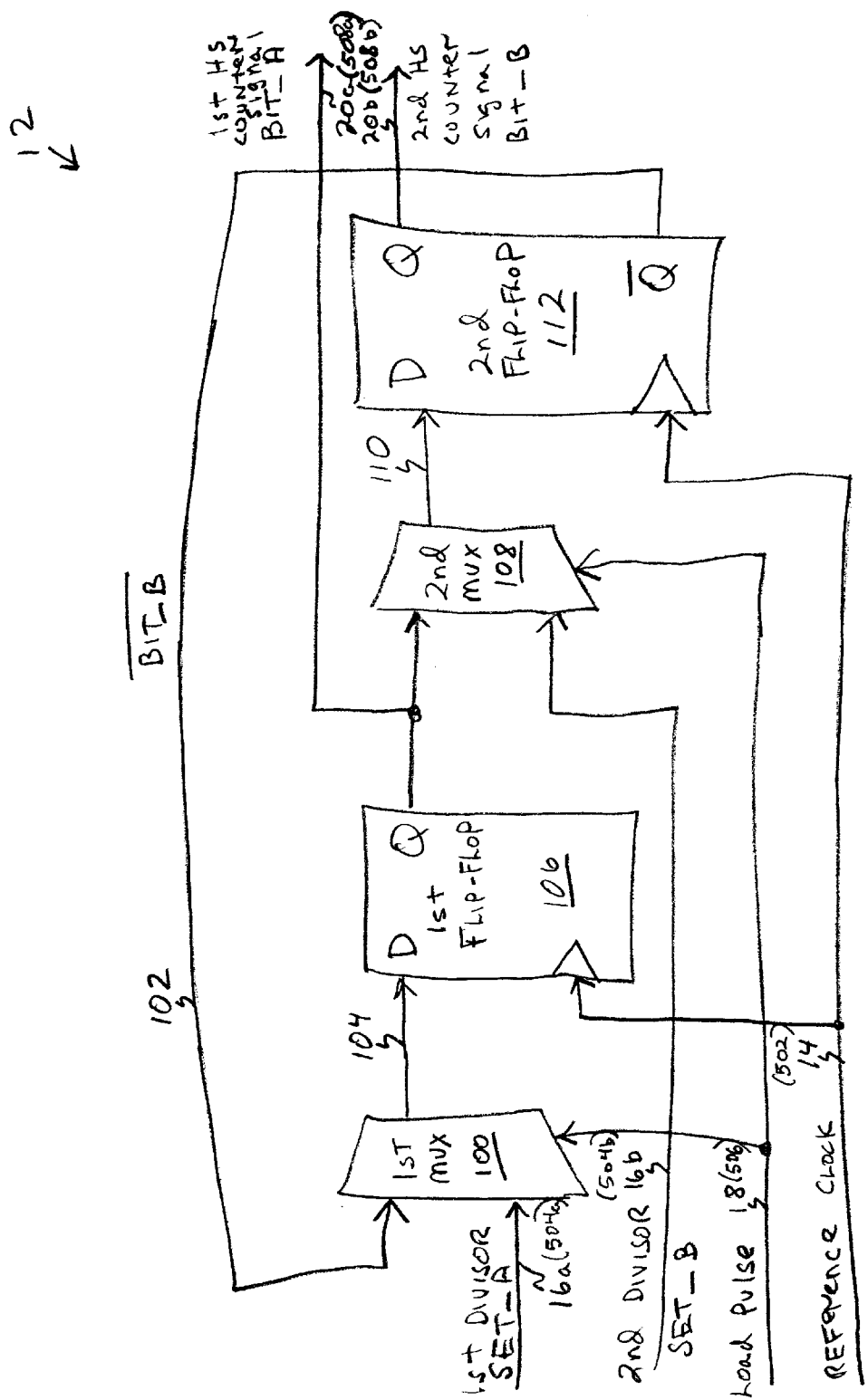
FIG. 2 is a detailed depiction of the high-speed counter of FIG. 1.

FIG. 2 is a detailed depiction of the high-speed counter 12 of FIG. 1. It should first be noted that in the exemplary two-stage version of the high-speed counter that there are two divisor commands required, a first and a second divisor command, which are respectively referred to herein as Set_A and Set_B. The high-speed counter 12 second input accepts first divisor commands on line 16a and second divisor commands on line 16b. Likewise, the two-stage counter supplies a first high-speed (HS) counter signal on line 20a and a second high-speed counter signal on line 20b, delayed with respect to the first high-speed counter signal. The first and second high-speed counter signals are also referred to herein, respectively, as Bit_A and Bit_B. Analogous, higher order, counters (not shown) would require additional divisor commands and supply additional high-speed counter signals.

A first multiplexor (MUX) 100 has a first input on line 16a to accept the first divisor command, and a second input on line 102 to accept the second high-speed counter signal. A inverted version of the second high-speed counter signal is shown ($\overline{\text{Bit\_B}}$). Alternately, the second high-speed counter signal (Bit_B) on line 20b can be used and an inversion process can be performed in the first MUX 100. The first MUX 100 also has a selection input to accept the load pulse on line 18. The first MUX 100 has an output on line 104 to supply the selected input signal in response to the load pulse.

A first flip-flop 106 has a first input on line 14 to accept the reference clock signal and a second input connected to the first MUX output on line 104. The first flip-flop 106 has an output to supply the first high-speed counter signal (Bit_A) on line 20a.

A second MUX 108 has a first input on line 16b to accept the second divisor command and a second input on line 20a to accept the first high-speed counter signal. The second MUX 108 has a selection input on line 18 to accept the load pulse and an output on line 110 to provide the selected input signal. A second flip-flop 112 has a first input on line 14 to accept the reference clock signal and a second input connected to the second MUX output on line 110. The second MUX 112 has an output on line 20b to supply the second high-speed counter signal (Bit_B).

As explained more fully below, the load circuit 26 (see FIG. 1) generates a load pulse as an initial condition. In response to receiving the load pulse signal on line 18, first MUX 100 and second MUX 108 respectively output the first and second divisor commands on lines 104 and 110. That is, the first flip-flop 106 is initialized to offset the first high-speed counter signal on line 20a, in response to receiving the first divisor command on line 16a. By offsetting the signal, it is meant that the high-speed counter signal edge, following initialization, is manipulated to either be advanced or delayed from the position it would be in if the second (default) divisor was being used. Alternately stated, initialization causes the period of the high-speed counter signal to be modified for one cycle of division.

Likewise, the second flip-flop 108 is initialized to offset the second high-speed counter signal on line 20b in response to the second divisor command on line 16b. In response to offsetting the high-speed counter signals, the first divisor is selected. After receiving the load pulse, the first and second flip-flops 106/112 return to a normal (default) mode of synchronous division, where the second divisor is used and the first and second flip-flops 106/112 respectively supply first and second high-speed counter signals on lines 20a/20b. It is the initialization process, which loads the value of the divisor command into the high-speed counter signal and permits the high-speed counter 12 to operate with a range of selectable first divisor values for a first number of division cycles. As signals provided to the low-speed counter 22, the offset high-speed signals appear as if they have undergone a periodic (with the load pulse defining the period) change in divisor. More details of this process are provided in the description of FIG. 5, below.

Some specific examples of the operation of the high-speed counter are presented below. When a first divisor command of "1" is provided on line 16a and a second divisor command of "0" is provided on line 16b, the first divisor is two. When the first divisor command is "0" and the second divisor command is "0", the second high-speed counter signal on line 20b, the first divisor is three. When the first divisor command is "0" and the second divisor command is "1", the first divisor is four. This combination of divisor commands is equivalent to the default (non-initialized) mode of operation. When the first divisor command is "1" and the second divisor command is "1", the first divisor is five. As is explained in more detail below, an overall division ratio for the counter 10 can be created by mixing division cycles between the above-mentioned first divisor options and the second divisor. Alternately stated, the momentary offsetting of the high-speed counter signals effectively changes the divisor for a division cycle, and the combination of divisors and division cycles creates an overall division ratio for counter 10.

Table 1 depicts the status of the second high-speed counter signal (Bit_B) with respect to (wrt) the divisor command options. M is the overall division ratio across the entire counter circuit 10.

TABLE 1

| | | | Waveform of Bit_B |
|---|---|---|---|
| M | Set_A | Set_B | Waveform of Bit_B wrt Ref Clock |
| 17 | 1 | 1 | 11100 1100 1100 1100 |
| 16 | 0 | 1 | 1100 1100 1100 1100 |
| 15 | 0 | 0 | 100 1100 1100 1100 |
| 14 | 1 | 0 | 10 1100 1100 1100 |

Figure 3:
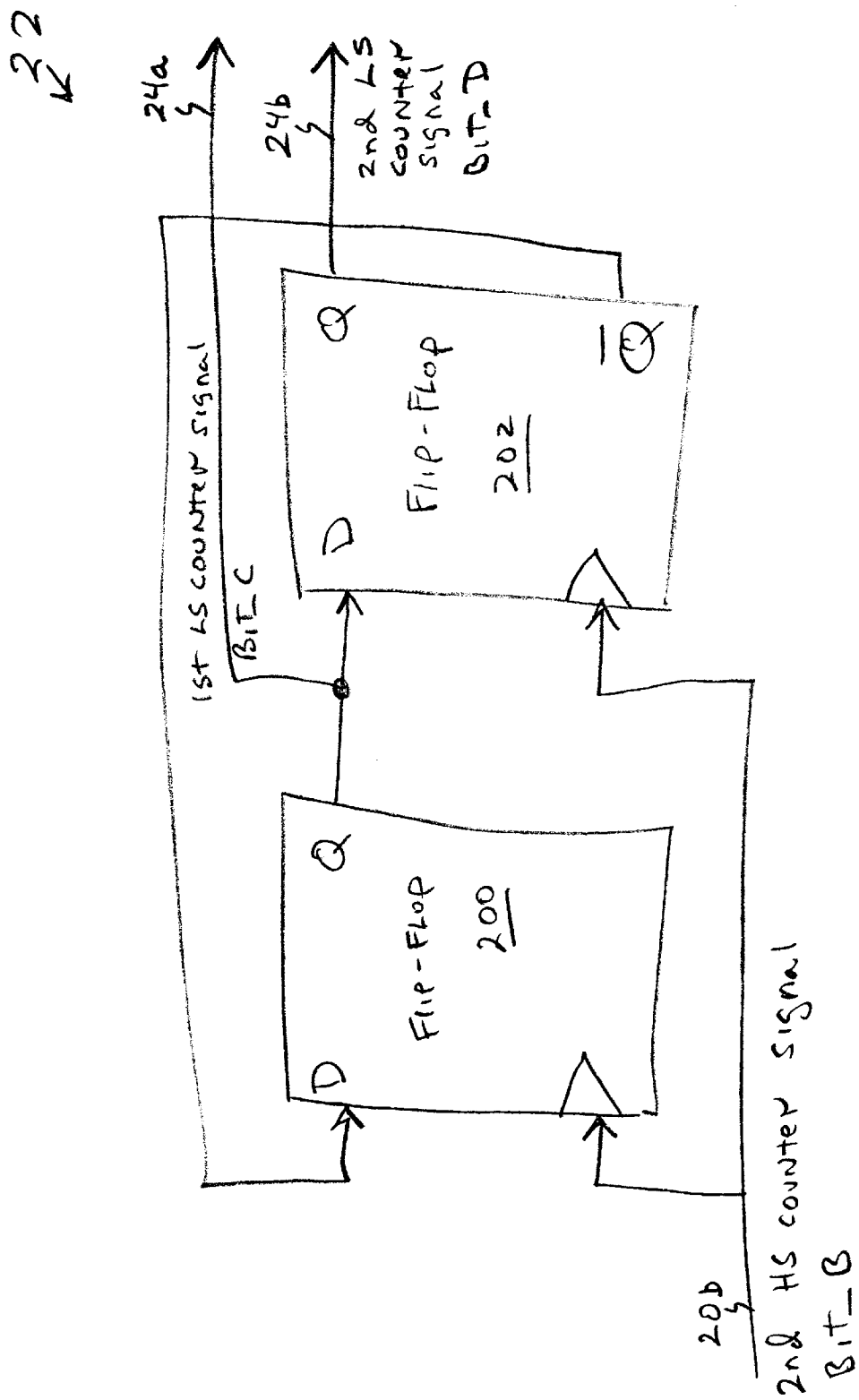
FIG. 3 depicts the low-speed counter circuit of FIG. 1 in greater detail.

FIG. 3 depicts the low-speed counter circuit 22 of FIG. 1 in greater detail. The low-speed counter 22 includes a two-stage flip-flip pair 200 and 202. The flip-flops 200/202 accept the second high-speed counter signal on line 20b and asynchronously divide this signal by four, as in understood well in the art. The low-speed counter 22 supplies a first low-speed (LS) counter signal, from flip-flop 200, on line 24a and a second low-speed counter signal, from flip-flop 202, on line 24b that is delayed with respect to the first low-speed counter signal on line 24a. A two-stage, divide-by-four low-speed counter is presented as an example. Alternately, the invention could be enabled with a higher order low-speed counter, with a corresponding change in the low-speed counter divisor and overall counter circuit division ratio.

Figure 4:
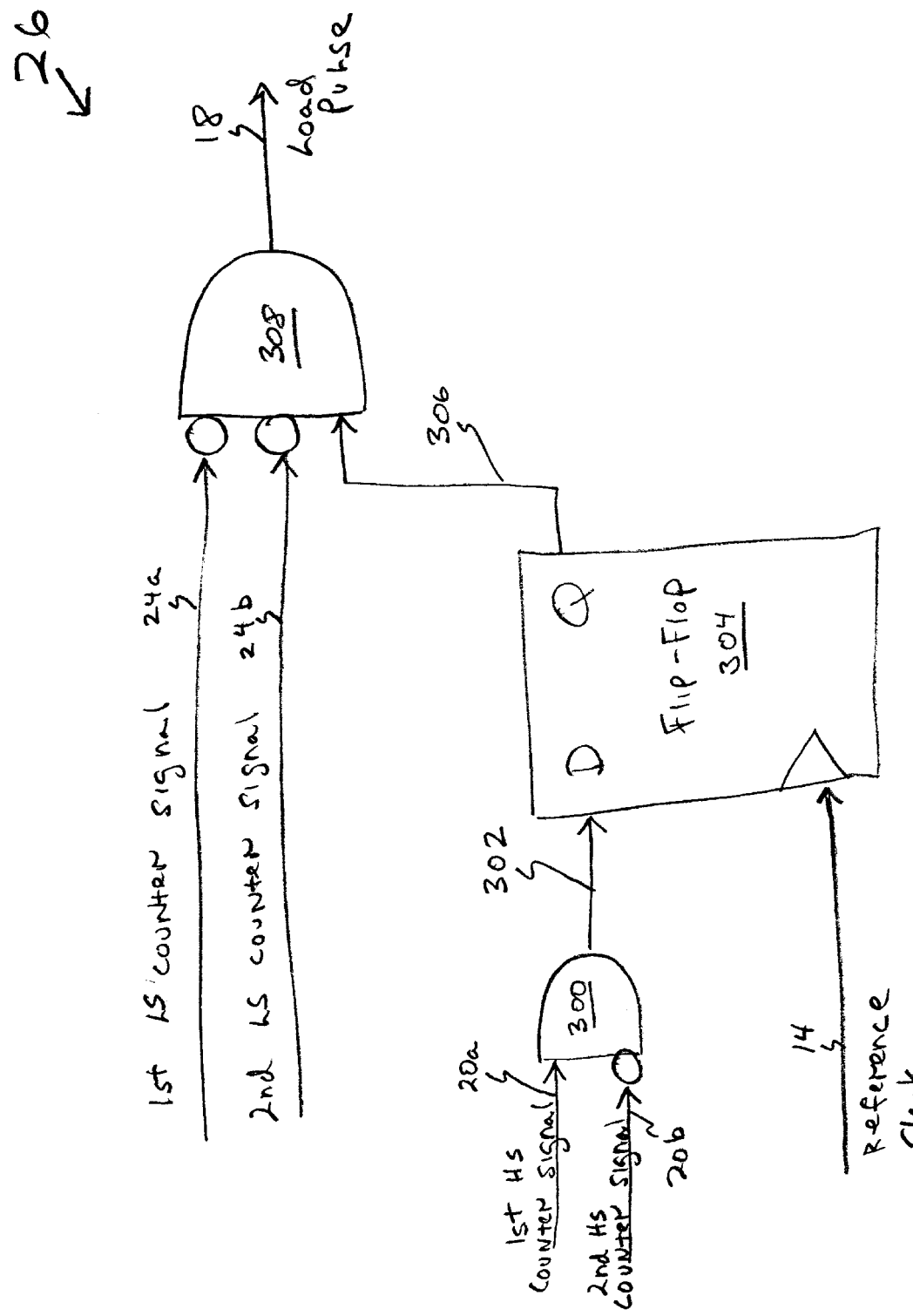
FIG. 4 depicts the load circuit of FIG. 1 in greater detail.

FIG. 4 depicts the load circuit 26 of FIG. 1 in greater detail. The first and second high-speed counter signals on lines 20a and 20b are presented to an AND gate 300 with an inverted input. The output of the AND gate 300, on line 302 is presented to a flip-flop 304, along with the reference clock on line 14, so that a resynchronized high-speed counter output is supplied on line 306. An AND gate 308 has an inverted input connected to line 24a to accept the first low-speed counter signal and an inverted input on line 24b to accept the second low-speed counter signal. The AND gate 308 also accepts the resynchronized output of the flip-flop 304 on line 306. The AND gate 308 supplies a load pulse on line 18 that is responsive to the phases of the combination of high-speed and low-speed counter signals.

Now that all the sub-sections have been described in detail, the overall operation of the counter circuit 10 can be described using the exemplary high-speed and low-speed counters. That is, for the purpose of the following examples it is assumed that the low-speed counter supplies a low-speed counter signal is a quotient of the high-speed counter signal divided by four, that high-speed counter performs four division cycles between reinitialization with the load pulse, that the second divisor is four, and that the first divisor is selected during one division cycle out of the four cycles.

Then, when the first divisor command on line 16a is "1" and the second divisor command on 16b is "0", the low-speed counter 22 supplies low-speed counter signals on lines 24a and 24b that are a quotient of the reference clock on line 14 divided by fourteen.

Figure 5:
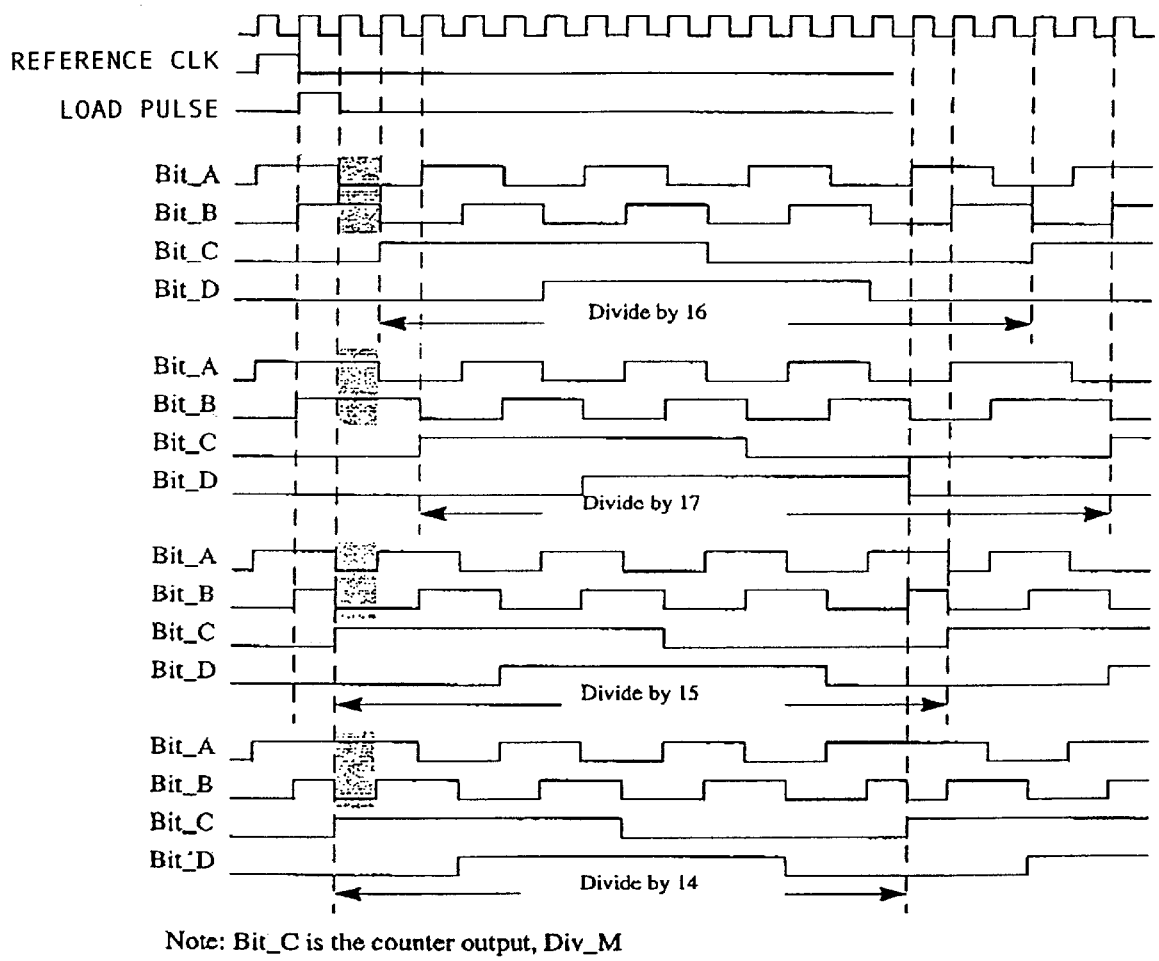
FIG. 5 is a graph depicting some critical waveforms in the operation of the present invention counter circuit of FIG. 1.

FIG. 5 is a graph depicting some critical waveforms in the operation of the present invention counter circuit of FIG. 1. With the coincidence to the rising edge of the first reference clock following the load pulse (high), the first high-speed counter signal (Bit_A) becomes the same as the first divisor command "1". Likewise, the second high-speed counter signal (Bit_B) becomes the same as the second divisor command "0". Because of high-speed counter signal offsets following initialization by the load pulse, the second high-speed counter signal (Bit_B) appears to momentarily to be divided by a different divisor than the default (second) divisor. That is, for one division cycle out of four, the second high-speed counter signal (Bit_B) appears to be divided by two, instead of by four. As a result, the second low-speed counter signal (Bit_D) divides the reference clock by fourteen, one cycle of two and three cycles of four (2+4+4+4=14).

In a similar manner, when the first divisor command is "0" and the second divisor command is "0", the low-speed counter signals are a quotient of the reference clock signal divided by fifteen. When the first divisor command is "0" and the second divisor command is "1", the low-speed counter signals are a quotient of the reference clock signal divided by sixteen. When the first divisor command is "1" and the second divisor command is "1", the low-speed counter signals are a quotient of the reference clock signal divided by seventeen.

Alternately stated, the high-speed counter 12 is usually a divide by 4 counter, however, the load pulse will cause the high-speed counter 12 to become a divide by 2, 3, 4, or 5 of the (external) reference clock signal, depending on Set_A and Set_B. Every division cycle contains one high-speed counter cycle of 2, 3, 4, or 5 bit times, followed by 3 high-speed counter cycles of 4 bit times.

The low-speed counter 22 is a divide-by-four ring counter of Bit_B (the high-speed counter signal). The low-speed counter 22 is clocked on the falling edge of Bit_B. This counter will cycle through one time every M external clock cycles, where M is equal to the overall division ratio of the counter circuit 10. The load circuit 26 decodes the last bit of the divide by M cycle and generates a one-bit time pulse. Because of the location in the cycle chosen for this pulse, only Bits A and B have critical timing, which is why they are resynchronized with the clock.

Table 1 shows the required logic levels of Set_A and Set_B required for the different values of M. Also shown is the waveform of Bit_B starting with the cycle in which the load pulse is high. To summarize the operation of the counter circuit 10, the high speed counter 12 cycles through its count 4 times. The first time it acts as a divide by 2, 3, 4, or 5, depending on the value of M. The other three times it is a divide by 4. The low speed counter is always a divide by 4, and the load logic generates a pulse which re-initializes the high speed counter once every M external clock cycles.

Figure 6:
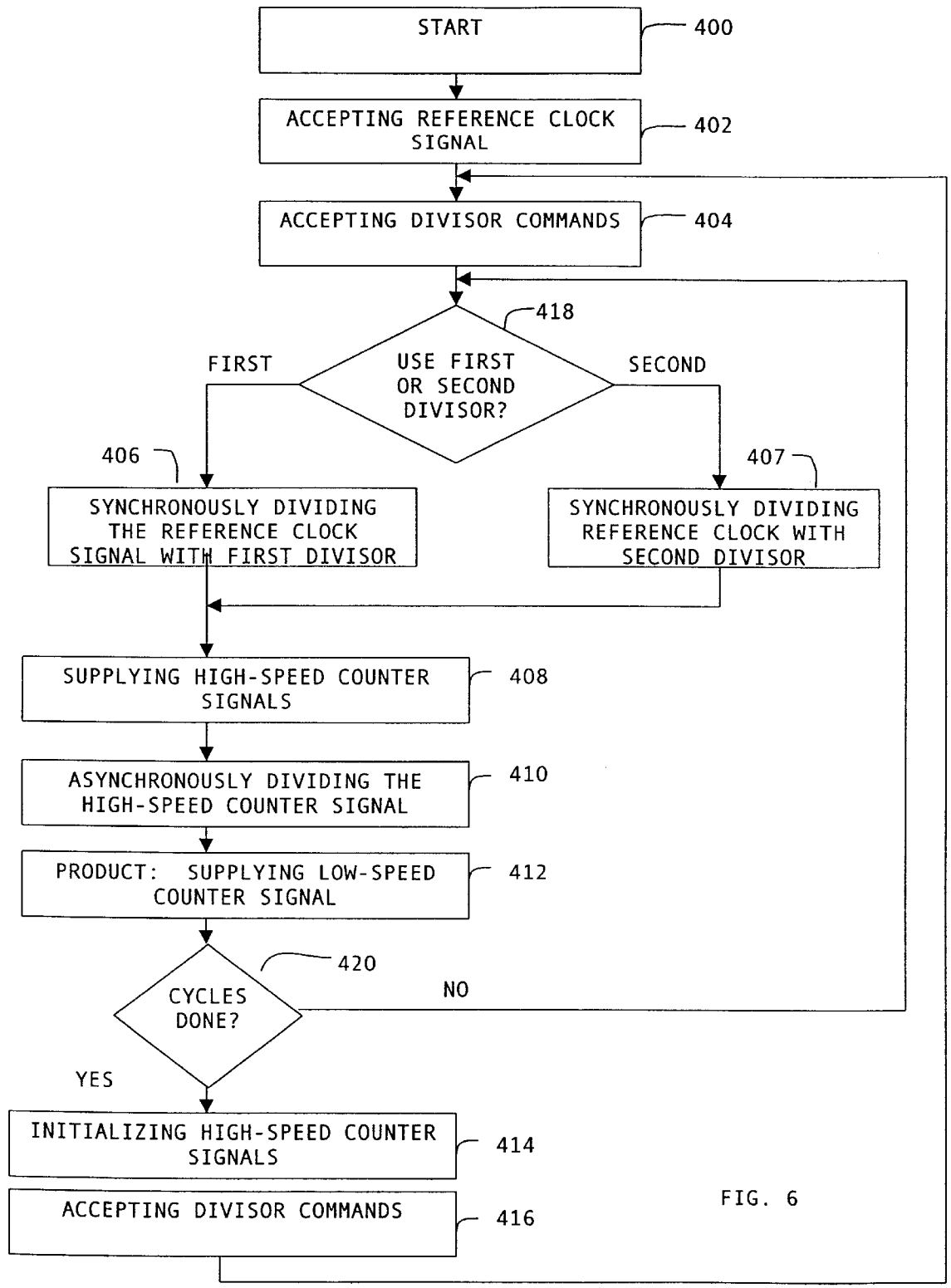
FIG. 6 is a flowchart illustrating a partially-synchronous method for dividing a high-speed reference clock with a selectable divisor.

FIG. 6 is a flowchart illustrating a partially-synchronous method for dividing a high-speed reference clock with a selectable divisor. Although the method is presented as a sequence of numbered steps for clarity, no order should be inferred from the numbering unless explicitly stated. Step 400 is the start. Step 402 accepts a reference clock signal. Step 404 accepts divisor commands. Step 406 synchronously divides the reference clock signal with a first divisor in response to the divisor commands. Step 408, in response to synchronously dividing the reference clock signal, supplies high-speed counter signals. Step 410 asynchronously divides the high-speed counter signals. Step 412 is a product where, in response to asynchronously dividing the high-speed counter signal, a low-speed counter signal is supplied.

In some aspects of the invention an additional step, Step 414, in response to the high-speed and low-speed counter signals, initializes the high-speed counter signals. Then, Step 416, in response to initializing the high-speed counter signals, accepts divisor commands, and the division process is repeated.

In some aspects of the invention, dividing the reference clock signal with the first divisor in Step 406 includes the divisor being an integer value selected from the group of odd and even integers.

In some aspects of the invention an additional step, Step 407 synchronously divides the reference clock signal with a second divisor.

In some aspects of the invention, supplying high-speed counter signals in Step 408 includes supplying a first high-speed counter signal and a second high-speed counter signal, delayed with respect to the first high-speed counter signal.

In some aspects of the invention, dividing the reference clock by the first divisor in Step 406 includes dividing by the first divisor for a first number of division cycles, and dividing the reference clock by the second divisor in Step 407 includes dividing by the second divisor for a second number of division cycles.

In some aspects of the invention, supplying low-speed counter signals in Step 412 includes supplying a first low-speed counter signal and a second low-speed counter signal, delayed with respect to the first low-speed counter signal. Then, initializing the high-speed counter signals in Step 414 includes initializing in response to the first and second low-speed counter signals, the first and second high-speed counter signals, and the reference clock signal.

In some aspects of the invention, accepting divisor commands in Step 404 includes accepting a first and second divisor command, and initializing the high-speed counter signals in Step 414 includes initializing the first and second high-speed count signals, respectively, with the first and second divisor commands. Then, supplying high-speed counter signals in Step 408 includes offsetting the first and second high-speed counter signals, respectively, with the first and second divisor commands accepted in Step 404. Decision block 418 is intended to illustrate the process of selecting either the first or second divisor. Decision block 420 is intended to illustrate the process continuing the synchronous division through all the division cycles.

In some aspects of the invention, a first divisor command of "1" is accepted and a second divisor command of "0" is accepted in Step 404. Then, selecting the first divisor in Step 406 includes selecting a first divisor of two. When a first divisor command of "0" is accepted and a second divisor command of "0" is accepted in Step 404. Then, selecting the first divisor in Step 406 includes selecting a first divisor of three. When a first divisor command of "0" is accepted and a second divisor command of "1" is accepted in Step 404. Then, selecting the first divisor in Step 406 includes selecting a first divisor of four. When a first divisor command of "1" is accepted and a second divisor command of "1" is accepted in Step 404. Then, selecting the first divisor in Step 406 includes selecting a first divisor of five.

As an example, in some aspects asynchronously dividing the high-speed counter signals in Step 410 includes dividing with a divisor of four, dividing the reference clock signal with the first divisor in Step 406 includes dividing for one division cycle (out of four), and dividing the reference clock signal with the second divisor in Step 407 includes dividing the reference clock signal with a divisor of four, for three division cycles. Then, when the first and second divisor commands accepted in Step 404 are "1" and "0", respectively, supplying the low-speed counter signals in Step 412 includes supplying a low-speed counter signal that is a quotient of the reference clock signal divided by fourteen.

Likewise, when the first and second divisor commands accepted in Step 404 are "0" and "0", supplying the low-speed counter signals in Step 412 includes supplying a low-speed counter signal that is a quotient of the reference clock signal divided by fifteen. When the first and second divisor commands accepted in Step 404 are "0" and "1", respectively, supplying the low-speed counter signals in Step 412 includes supplying a low-speed counter signal that is a quotient of the reference clock signal divided by sixteen. When the first and second divisor commands accepted in Step 404 are "1" and "1", supplying the low-speed counter signals in Step 412 includes supplying a low-speed counter signal that is a quotient of the reference clock signal divided by seventeen.

Figure 7:
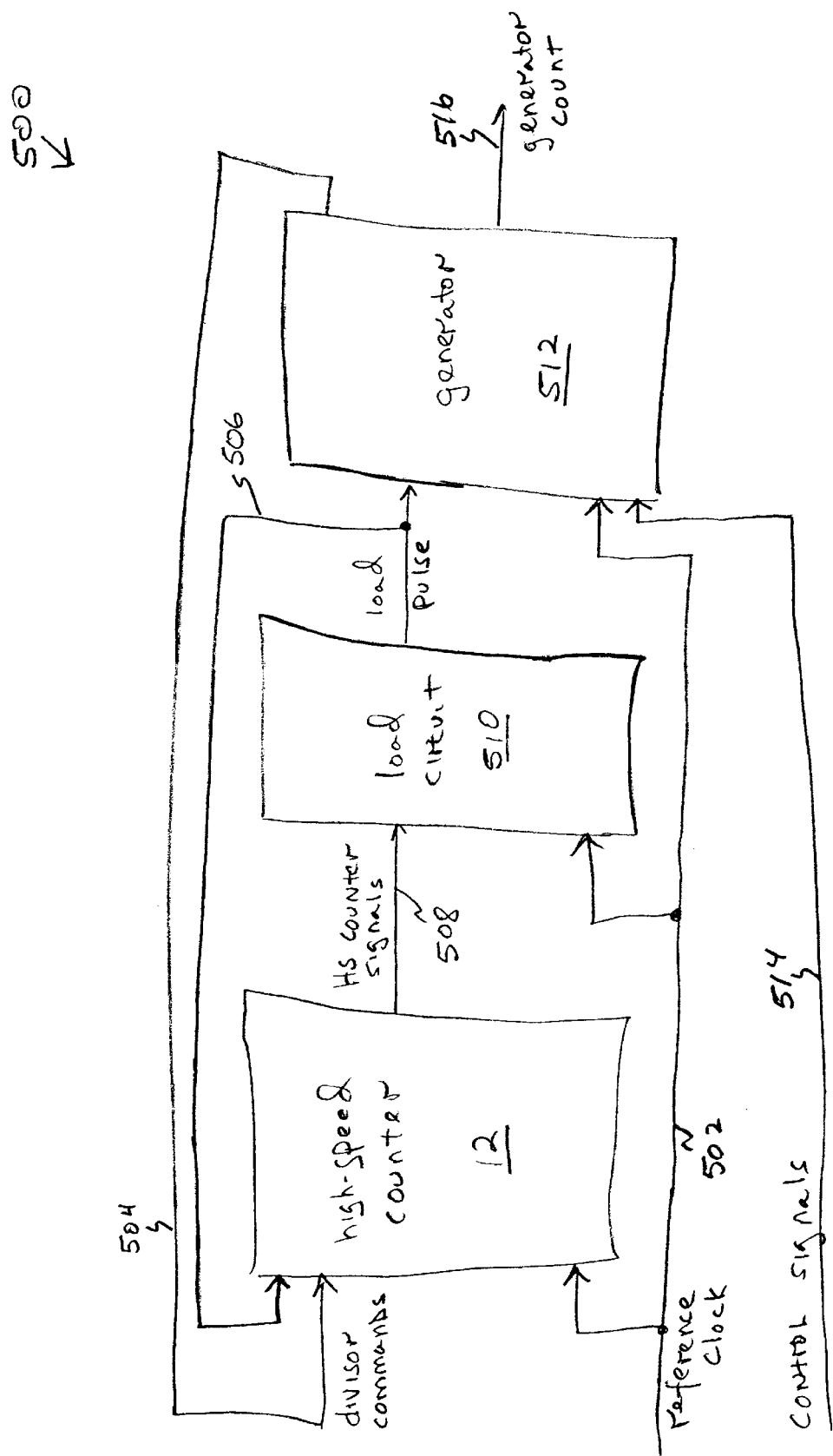
FIG. 7 is a schematic block diagram of the present invention high-speed non-integer counter with selectable divisor.

FIG. 7 is a schematic block diagram of the present invention high-speed non-integer counter circuit 500 with selectable divisor. Preferably, counter 500 is fabricated as part of an IC. The counter 500 comprises a high-speed counter section 12, essentially the same as the high-speed counter 12 of FIG. 2. The high-speed counter has a first input to accept a reference clock signal on line 502, a second input to accept divisor commands on line 504, and a third input to accept a load pulse on line 506. The high-speed counter 12 synchronously divides the reference clock signal on line 502 in response to the load pulse on line 506 with a selectable first divisor responsive to divisor commands on line 504. The high-speed counter 12 supplies high-speed counter signals at an output on line 508. As with the counter 10, a second divisor is used as a default divisor, when the first divisor is not selected. Also as above, the first divisor is selected for a first number of division cycles and the second divisor is used in a second number of division cycles.

A load circuit 510 has an input connected to the high speed counter output on line 508 to accept the high-speed counter signals and an input to accept the reference clock signal on line 502, for sycnronizing the high-speed counter signals to the reference clock signal. The load circuit 510 has an output connected to the third input of the high-speed counter on line 506 to provide a load pulse that is responsive to the syncronized high-speed counter signals.

A generator 512 has an input connected to the output of the load circuit on line 506 to accept the load pulse, an input to accept the reference clock signal on line 502, and an input on line 514 to accept control signals. The generator 512 has an output to provide the divisor commands on line 504, which are responsive to the control signals on line 514. The generator 512 also has an output on line 516 to supply a generator count signal that is a synchronously divided quotient of the load pulse on line 506.

The details of the high-speed counter 12 are as explained above in the description of FIG. 2. With respect to FIG. 2, however, it should be noted that the first and second divisor commands (Set_A and Set_B) of counter circuit 500 are supplied on lines 504a and 504b, respectively, which are the numbers in parenthesis. Likewise, the reference clock signals of counter circuit 500 are provided on line 502 (in parenthesis), and the first and second high-speed counter signals (Bit_A and Bit_B) are on lines 508a and 508b, respectively. Finally, the load pulse is provided on line 506, in parenthesis.

As explained above, when a first divisor command of "0" is supplied on line 504a and a second divisor command of "1" is supplied on line 504b, the second high-speed counter signal on line 508b is a quotient of the reference clock signal divided by four. That is, the first divisor is four. When the first divisor command is "0" and the second divisor command is "0", the second high-speed counter signal is a quotient of the reference clock signal divided by three. When the first divisor command is "1" and the second divisor command is "1", the second high-speed counter signal is a quotient of the reference clock signal divided by five.

Figure 8:
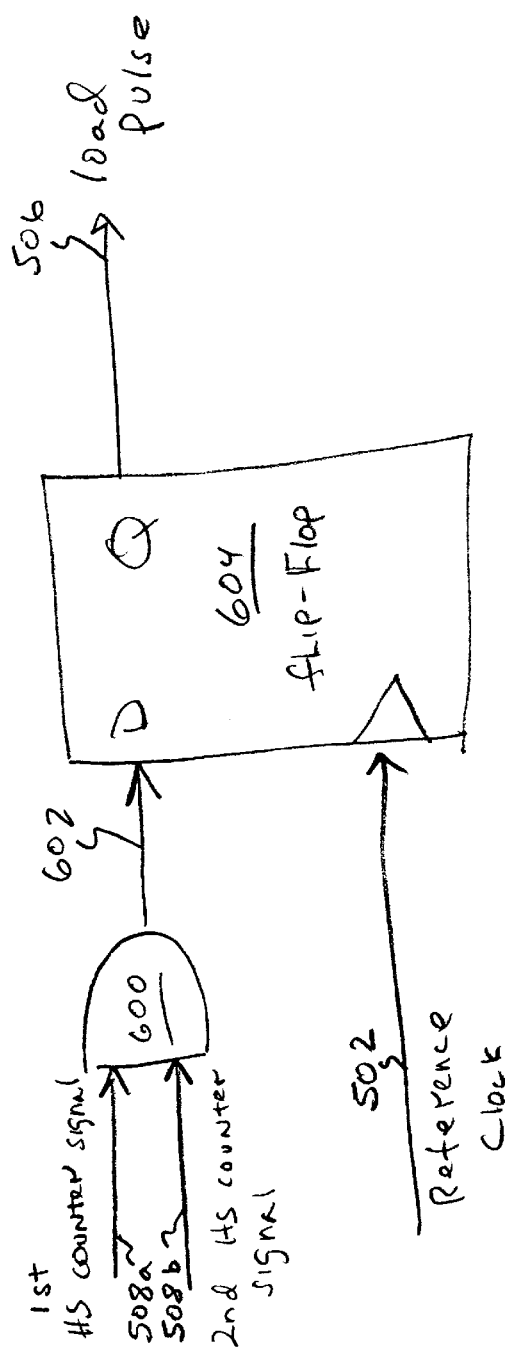
FIG. 8 is a detailed depiction of the load circuit of FIG. 7.

FIG. 8 is a detailed depiction of the load circuit 510 of FIG. 7. The first and second high-speed counter signals (Bit_A and Bit_B) on lines 508a and 508b, respectively, are supplied to an AND gate 600. The output of the AND gate 600 on line 602 are supplied to a flip-flop 604, that is clock with the reference clock on line 502. Thus, the load pulse on line 506 is a resyncronized quotient of the high-speed counter 12.

Figure 9:
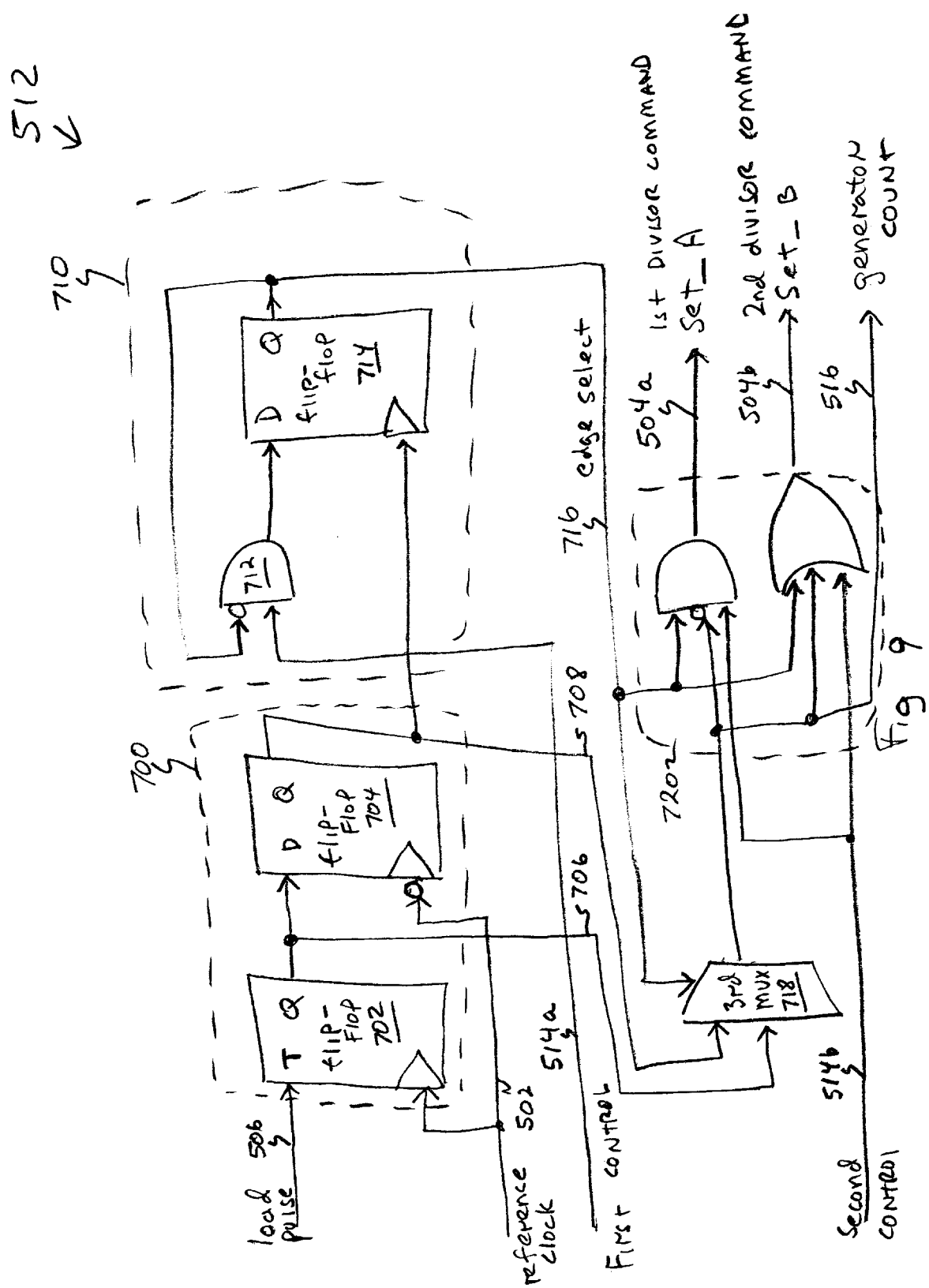
FIG. 9 is a detailed depiction of the click generator of FIG. 7.

FIG. 9 is a detailed depiction of the generator 512 of FIG. 7. The generator 512 includes a low-speed counter 700 (enclosed by dotted lines), which in turn includes flip-flops 702 and 704. The low-speed counter 700 has a first input on line 506 to accept the load pulse and a second input on line 502 to accept the reference clock. The low-speed counter 700 synchronously divides the load pulse by two to provide a divide-by-two signal (HSDIV2) at a first output on line 706 and a delayed divide-by-two signal at a second output on line 708.

An edge select circuit 710, enclosed by dotted lines, includes an AND gate 712 and a flip-flop 714. The edge select circuit has a first input connected to the low-speed counter second output on line 708 to accept the delayed divide-by-two signal and a second input on line 514a to accept a first control signal (control 0). The edge select circuit 710 divides the delayed divide-by-two signal to create an edge select signal. The edge select signal is selectively provided at an output on line 716 in response to the first control signal on line 514a.

A third MUX 718 has a first input connected to the first output of the low-speed counter 700 on line 706 to accept the divide-by-two signal. The third MUX 718 has a second input connected to the second output of the low-speed counter 700 to accept the delayed divide-by-two signal on line 708 and a select port connected to the output of the edge select circuit 710 on line 716 to accept the edge select signal. The third MUX 718 has an output to supply the generator count on line 516, in response to the edge select signal on line 716.

A logic circuit 720 (enclosed by dotted lines), including an AND gate 722 and a NOR gate 724, has a first input connected to the output of the third MUX on line 516 to accept the generator count, a second input connected to the output of the edge select circuit 710 on line 716 to accept the edge select signal, and a third input to accept the second control signal (control 1) on line 514b. The logic circuit 720 has a first output on line 504a to supply the first divisor command (Set_A) and a second output on line 504b to provide the second divisor command (Set_B).

It should be noted that the low-speed counter 700, edge select circuit 710, and logic circuit 720 are exemplary only, as the same processes can be accomplished with a variety of other design approaches.

When a first control signal of "1" is provided on line 514a and a second control signal of "0" is provided on line 514b, the logic circuit first output on line 504a supplies a value of "0" for the first divisor command and the logic circuit second output on line 504b supplies values selected from the group including "0" and "1" for the second divisor command. Then, the third MUX output on line 516 supplies a generator count signal that is a quotient of the reference clock signal divided by 7.5.

Figure 10:
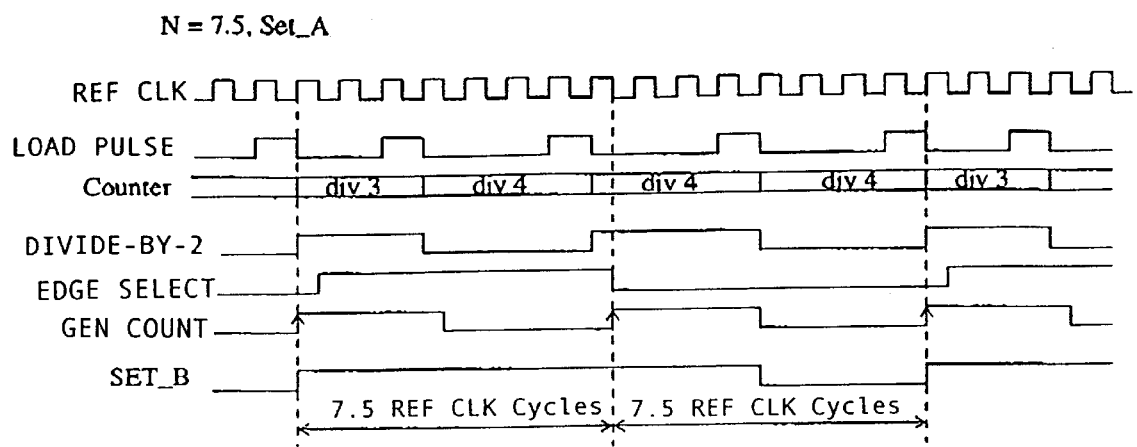
FIG. 10 illustrates the waveform associated with N=7.5 for the counter circuit of FIG. 7.

FIG. 10 illustrates the waveform associated with N=7.5 for the counter circuit 500 of FIG. 7. When edge select is low, the third MUX 718 (see FIG. 9) selects the divide-by-two signal. When edge select is high, the third MUX selects the delayed divide-by two version of HSDIV2 (not shown). Edge select toggles continuously with every generator count cycle during this mode, so the rising edge of the generator count signal alternates between starting at the same time as the divide-by-two signal (HSDIV2) and starting one half of a bit time (reference clock cycle) later.

Each generator count cycle contains either a divide by 3 cycle and a divide by 4 cycle of the high speed counter for a total of 7 bit times, or two divide by 4 cycles of the high speed counter for a total of 8 bit times. During a 7 bit time cycle (which starts with a rising edge of generator count), the third MUX selects the divide-by two signal (HSDIV2) for the first rising edge of generator count at the beginning of the cycle. Shortly after the beginning of the cycle, edge select toggles, and the third MUX selects the delayed divide-by-two signal for the second rising edge of generator count at the end of the cycle. This provides the extra half of a bit time for the generator count cycle.

During an 8 bit cycle time, the third MUX selects the delayed divide-by-two signal for the first rising edge of the generator count at the beginning of the cycle (which is the same as the second rising edge at the end of the previous cycle). Shortly after the beginning of the cycle, edge select toggles, and the third MUX selects the divide-by-two signal (HSDIV2) for the second rising edge of generator count at the end of the cycle. This reduces the generator count cycle from 8 bit times to 7.5 bit times. There are at least 3 bit times from the time when the high-speed counter is loaded with the value of second divisor command (Set_B) until the next time, so the propagation delay from the load pulse to Set_B is not critical.

When a first control signal of "0" is provided on line 514a and second control signal of "0" is provided on line 514b, the logic circuit first output on line 504a supplies a value of "0" for the first divisor command and the logic circuit second output on line 504b supplies values selected from the group including "0" and "1" for the second divisor command. Then, the third MUX output on line 516 (see FIG. 9) supplies a generator count signal that is a quotient of the reference clock signal divided by seven.

Figure 11:
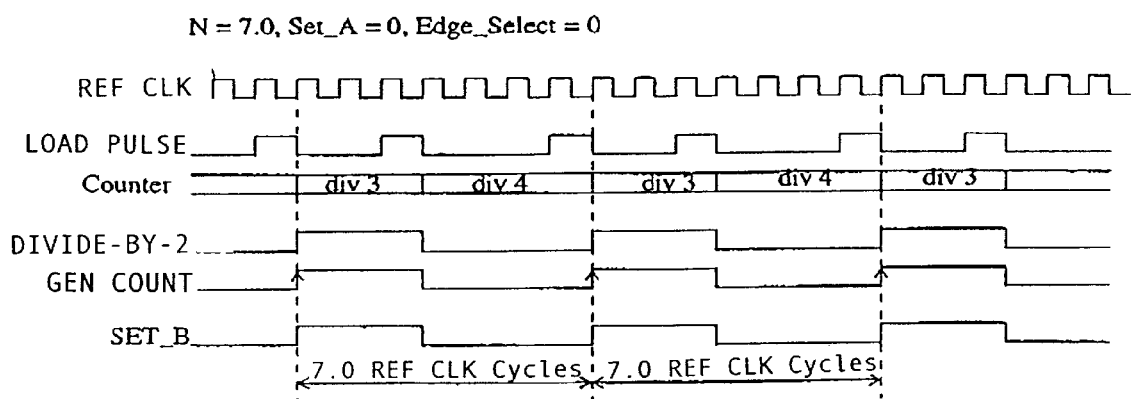
FIG. 11 illustrates the waveform associated with N=7.0 for the counter circuit of FIG. 7.

FIG. 11 illustrates the waveform associated with N=7.0 for the counter circuit 500 of FIG. 7. As the generator count signal changes state, Set_B causes the high speed counter to initially divide by 3, and then a divide by 4 for a total of 7 reference clock cycles per one generator count cycle. The divide-by-two signal changes state after the counter is loaded. This causes generator count to change, which causes Set_B to change. The propagation delay from load pulse to Set_B is not critical since there are at least 3 reference clock cycles from the time that the value of Set_B is loaded until the next time that it is loaded.

When a first control signal of "0" is provided on line 514a and a second control signal of "1" is provided on line 514b, the logic circuit first output on line 504a supplies a value of "0" for the first divisor command and the logic circuit second output on line 504b supplies a value of "1" for the second divisor command. Then, the third MUX output on line 516 supplies a generator count signal that is a quotient of the reference clock signal divided by eight.

Figure 12:
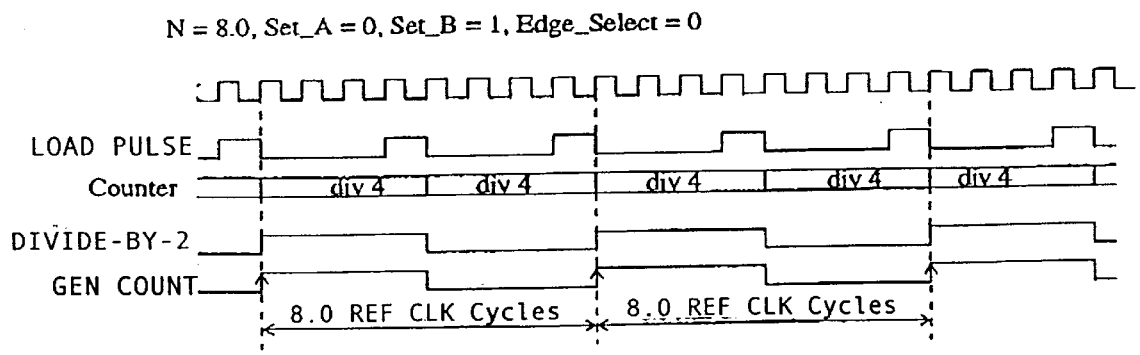
FIG. 12 illustrates the waveform associated with N=8.0 for the counter circuit of FIG. 7.

FIG. 12 illustrates the waveform associated with N=8.0 for the counter circuit 500 of FIG. 7. The first and second divisor commands (Set_A and Set_B) are fixed so that the high speed counter is always initialized to a divide by 4. The generator count always makes up of two cycles of the high speed counter.

When a first control signal of "1" is provided on line 514a and a second control signal of "1" is provided on line 514b (see FIG. 9), the logic circuit first output on line 504a supplies value selected from the group including "0" and "1" for the first divisor command and the logic circuit second output on line 504b supplies a value of "1" for the second divisor command. Then, the third MUX output on line 516 supplies a generator count signal that is a quotient of the reference clock signal divided by 8.5.

Figure 13:
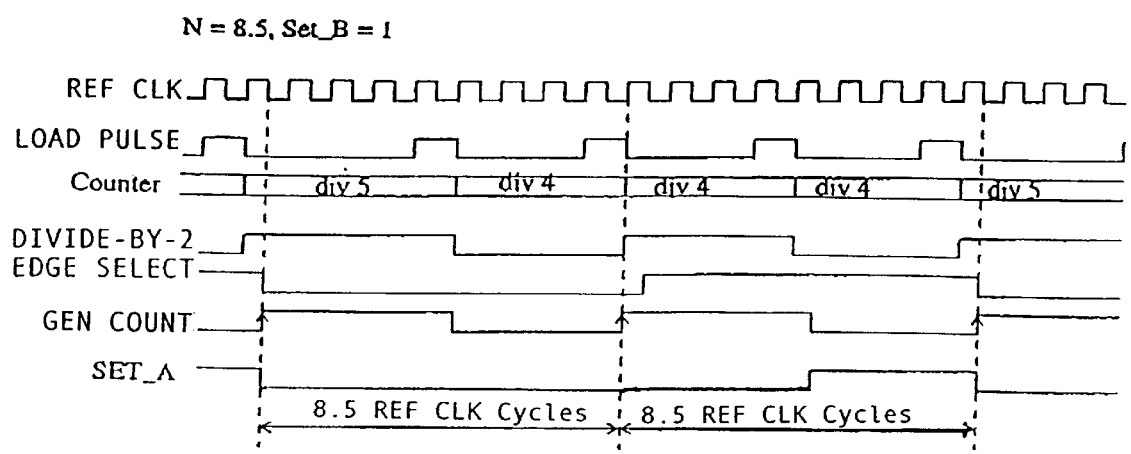
FIG. 13 illustrates the waveform associated with N=8.5 for the counter circuit of FIG. 7.

FIG. 13 illustrates the waveform associated with N=8.5 for the counter circuit 500 of FIG. 7. As in the case of N=7.5 (see FIG. 10), edge select toggles continuously with every generator count cycle, so the rising edge of the generator count alternates between starting at the same time as divide-by-two signal (HSDIV2) and starting one half of a bit time later with the delayed divide-by-two signal.

Each generator count cycle contains either a divide-by-4 cycle and a divide-by-5 cycle of the high speed counter for a total of 9 bit times, or two divide-by-4 cycles of the high speed counter for a total of 8 bit times. During a 9-bit time cycle (which starts with a rising edge of the generator count), the third MUX 718 (see FIG. 9) selects the delayed divide-by-two signal for the first rising edge of the generator count at the beginning of the cycle. Shortly after the beginning of the cycle, edge select toggles, and the third mux selects the divide-by-two signal (HSDIV2) for the second rising edge of the generator count at the end of the cycle. This reduces the generator count cycle from 9 bit times to 8.5 bit times.

During an 8 bit cycle time, the third MUX selects the delayed divide-by-two signal for the first rising edge of the generator count at the beginning of the cycle. Shortly after the beginning of the cycle, edge select toggles, and the third MUX selects the delayed divide-by-two signal for the second rising edge of generator count at the end of the cycle. This provides the extra half of a bit time for the generator count cycle.

As shown in FIGS. 2, 7, 8, and 9, the counter circuit is exemplified as a divide by 7.0 to 8.5 counter. Other divisor and selectable divisor ranges can be enabled with additional stages in the high-speed counter 12 and/or low-speed counter 700. The high speed counter 12 operates as a divide by 3, 4, or 5 from the reference clock, depending on the value of N set by the control signals, and the Current states of Set_A and Set_B from the logic circuit 720, where N is the overall divisor of the counter circuit 500. The generator 512 generates the divide by N generator count signal from the incoming load pulse on line 506.

Table 2 illustrates the relationship between signals and the divide count. The high-speed counter 12 cycles through its variable count twice for every generator count cycle. The high-speed counter 12 (see FIG. 2) is initialized by the load pulse on line 506, and the initial state is determined by two divisor commands on lines 504a and 504b (Set_A and Set_B). Thus, when the value of N is 7.0, the high-speed counter 12 alternates between divide by 3 and divide by 4 operation. When the value of N is 7.5, the high-speed counter 12 has one divide by 3 cycle and 3 divide by 4 cycles in a period of two 7.5 clock cycles. When the value of N is 8.0, the high-speed counter 12 operates as a divide by 4. When the value of N is 8.5, the high-speed counter 12 has one divide by 5 cycle and 3 divide by 4 cycles in a period of two 8.5 clock cycles. A divide by 5 counter is obtained when the high-speed counter 12 is initialized to the same state as the current state. Note that when first control signal (control 0) is "0", edge select can only be "0".

TABLE 2

High Speed Counter Control

| N | Control 0/ Control 1 | edge select/ comp clk | Set_A/ Set_B | Counter Operation |
|---|---|---|---|---|
| 7.0 | 00 | 00 | 00 | Divide by 3 |
|  |  | 01 | 01 | Divide by 4 |
| 7.5 | 10 | 00 | 00 | Divide by 3 |
|  |  | 01 | 01 | Divide by 4 |
|  |  | 10 | 01 | Divide by 4 |
|  |  | 11 | 01 | Divide by 4 |
| 8.0 | 01 | 00 | 01 | Divide by 4 |
|  |  | 01 | 01 | Divide by 4 |
| 8.5 | 11 | 00 | 01 | Divide by 4 |
|  |  | 01 | 01 | Divide by 4 |
|  |  | 10 | 11 | Divide by 5 |
|  |  | 11 | 01 | Divide by 4 |

The generator 512 generates the divide-by-two signal on line 706 that transitions with every load pulse on line 506. This is effectively a divide by 2 of the high speed counter output on line 508b. This divide-by-two signal is then delayed by one half of a serial clock cycle to form the delayed divide-by-two signal on line 708.

When the value of N is 7.0 or 8.0, the first control signal on line 514a (control 0) is a logic zero, so edge select is always low, and divide-by-two signal is always selected for the generator count. When N is 7.5 or 8.5, the first control signal (control 0) is a logic one, so that the edge select signal is a divide by 2 of delayed divide-by-two signal. This will cause the rising edge of the generator count to alternate back and forth by one half cycle with respect to the divide-by-two signal.

The logic circuit 720 controls the operation of the high speed counter 12. Generator count is a divide by 2 of the high-speed counter 12 and edge select is a divide by 4. In 4 cycles of the high-speed counter 12 (2 generator count cycles), Set_A and Set_B initialize the high-speed counter 12 to obtain the desired value of N.

Figure 14:
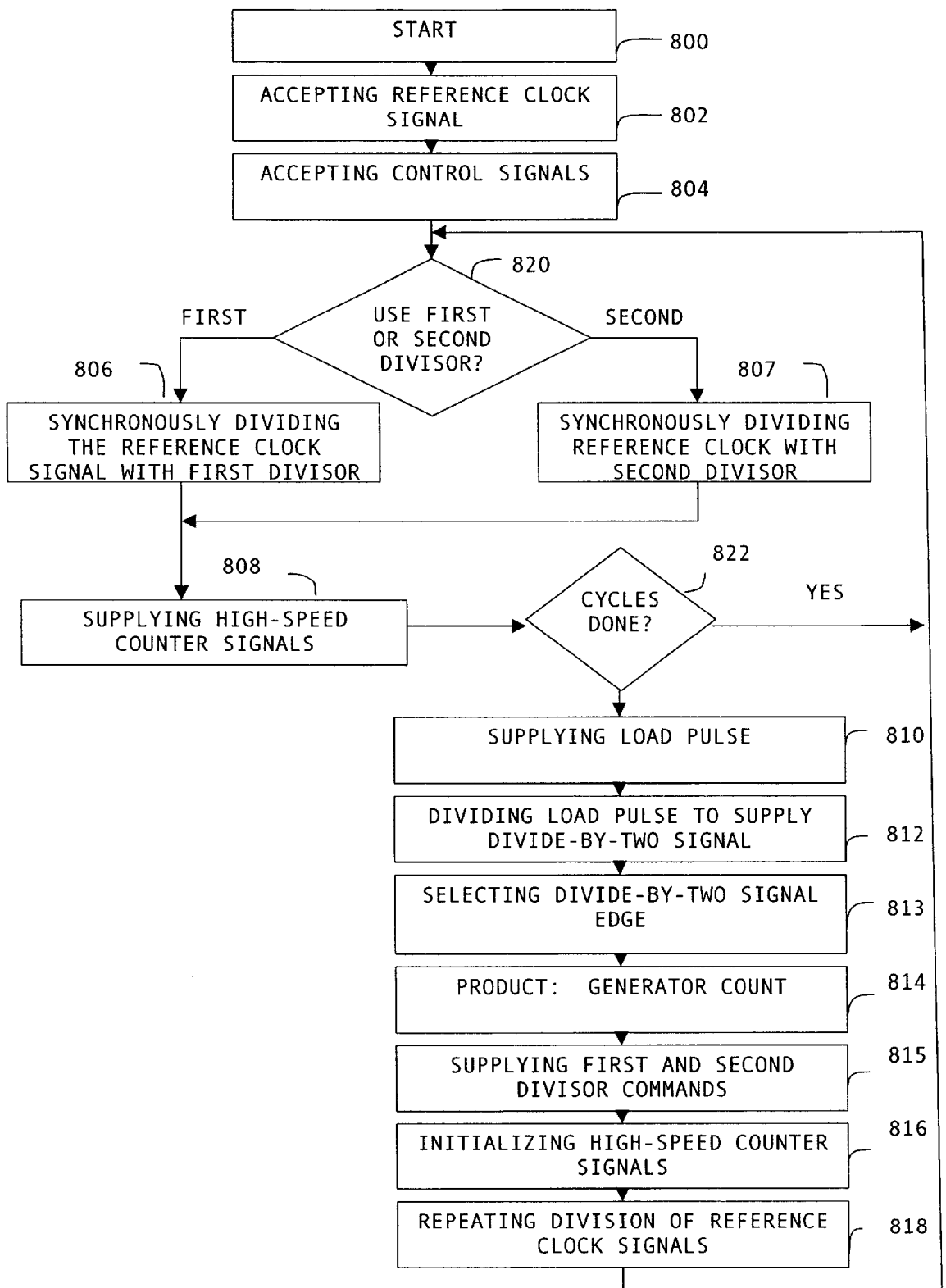
FIG. 14 is a flowchart illustrating a high-speed non-integer method for dividing a high-speed reference clock with a selectable divisor.

FIG. 14 is a flowchart illustrating non-integer method for dividing a high-speed reference clock with a selectable divisor. Although the method is presented as a sequence of numbered steps for clarity, no order should be inferred from the numbering unless explicitly stated. Step 800 is the start. Step 802 accepts a reference clock signal. Step 804 accepts control signals. Step 806 synchronously divides the reference clock signal with a first divisor in response to the control signals accepted in Step 804. Step 808, in response to synchronously dividing the reference clock signal, supplies high-speed counter signals. Step 810, in response to high-speed counter signals and the reference clock signals, supplies a load pulse. Step 812 divides the load pulse to supply a divide-by-two signal. Step 813 selects a divide-by-two signal edge. Step 814 is a product where, in response to the divide-by-two signal edge and the control signals, a generator count signal is supplied.

In some aspects of the invention there are further steps. Step 816, in response to the generator count signal and the control signals, initializes the high-speed counter signals. Step 818, in response to initializing the high-speed counter signals, repeats the division of the reference clock signal with the first divisor.

In some aspects of the invention, dividing the reference clock signal with the first divisor in Step 806 includes the first divisor being an integer value selected from the group of odd and even integers.

Some aspects of the invention include further steps. Step 807 synchronously divides the reference clock signals with a second divisor. Dividing the reference clock by the first divisor in Step 806 includes dividing by the first divisor for a first number of division cycles, and dividing the reference clock by the second divisor in Step 807 includes dividing by the second divisor for a second number of division cycles.

In some aspects of the invention, supplying high-speed counter signals in Step 808 includes supplying a first high-speed counter signal and a second high-speed counter signal, delayed with respect to the first high-speed counter signal.

In some aspects of the invention, supplying the divide-by-two signal in Step 812 includes supplying a delayed divide-by-two signal. Selecting a divide-by-two signal edge in Step 813 includes selecting either the divide-by-two or the delayed divide-by-two signal. Then, the method includes a further step. Step 815 supplies first and second divisor commands in response to the divide-by-two signal edge and the reference clock signal. Then, initializing the high-speed counter signals in Step 816 includes initializing the high-speed counter signals in response to the divisor commands.

In some aspects of the invention, initializing the high-speed counter signals in Step 816 includes initializing the first and second high-speed count signals, respectively, with the values of the first and second divisor commands. Then, supplying high-speed counter signals in Step 808 includes offsetting the first and second high-speed counter signals, respectively, in response to the first and second divisor commands. The process of determining whether the first or second divisor is to be used is represented by decision block 820. The process of determining the number and division cycle order is represented with decision block 822.

In some aspects of the invention, a first divisor command of "0" is supplied and a second divisor command of "0" is supplied in Step 815. Then, selecting the first divisor in Step 806 includes selecting a first divisor of three. When a first divisor command of "0" is supplied and a second divisor command of "1" is supplied in Step 815. Then, selecting the first divisor in Step 806 includes selecting a first divisor of four. When a first divisor command of "1" is supplied and a second divisor command of "1" is supplied in Step 815. Then, selecting the first divisor in Step 806 includes selecting a first divisor of five.

When a first control signal of "1" is provided and a second control signal of "0" is provided in Step 804, a value of "0" is supplied for the first divisor command and wherein values selected from the group including "0" and "1" are supplied for the second divisor command in Step 815. Dividing the reference clock signal with the first divisor in Step 806 includes dividing for one division cycle, and dividing the reference clock signal with the second divisor in Step 807 includes dividing for three division cycles. Then, supplying the generator count signal in Step 814 includes the generator count signal being a quotient of the reference clock signal divided by 7.5.

When a first control signal of "0" is provided and a second control signal of "0" is provided in Step 804, a value of "0" is supplied for the first divisor command and wherein values selected from the group including "0" and "1" are supplied for the second divisor command in Step 815. Dividing the reference clock signal with the first divisor in Step 806 includes dividing for one division cycle, and dividing the reference clock signal with the second divisor in Step 807 includes dividing for three division cycles. Then, supplying the generator count signal in Step 814 includes the generator count signal being a quotient of the reference clock signal divided by seven.

When a first control signal of "0" is provided and a second control signal of "1" is provided in Step 804, a value of "0" is supplied for the first divisor command and a value of "1" is supplied for the second divisor command in Step 815. Dividing the reference clock signal with the first divisor in Step 806 includes dividing for one division cycle, and dividing the reference clock signal with the second divisor in Step 807 includes dividing for three division cycles. Then, supplying the generator count signal in Step 814 includes the generator count signal being a quotient of the reference clock signal divided by eight.

When a first control signal of "1" is provided and a second control signal of "1" is provided in Step 804, wherein values selected from the group including "0" and "1" are supplied for the first divisor command and a value of "1" is supplied for the second divisor command in Step 815. Dividing the reference clock signal with the first divisor in Step 806 includes dividing for one division cycle, and dividing the reference clock signal with the second divisor in Step 807 includes dividing for three division cycles. Then, supplying the generator count signal in Step 814 includes the generator count signal being a quotient of the reference clock signal divided by 8.5.

Counter circuits, and corresponding methods of dividing a reference clock signal in a partially-synchronous manner have been described above. The circuits use a high-speed synchronous counter that cycles between the use of a first and second divisor, to give the counter circuit a selectable overall division ratio. Asynchronous dividers are added to complete the division process, using sufficient synchronous division to meet minimum edge stability requirements. Specific examples are presented with specific number of stages, and corresponding divisors and divisor ranges. However, the invention is not limited to just the examples presented. It should also be noted that although various logical functions have been exemplified with specific circuit implementations, there are many well known logic circuits that perform equivalently. Other variations and embodiments of the invention will occur to those skilled in the art.

We claim:

1. In an integrated circuit, a high-speed partially-synchronous counter circuit with selectable divisor comprising:

a high-speed counter section having a first input to accept a reference clock signal, a second input to accept divisor commands, a third input to accept a load pulse, the high-speed counter synchronously dividing the reference clock signal in response to the load pulse with a selectable divisor responsive to divisor commands, providing high-speed counter signals at an output;

a low-speed counter section having an input connected to the output of the high-speed counter to accept the high-speed counter signals, the low-speed counter asynchronously dividing the high-speed counter signals by a fixed value to provide low-speed counter signals at an output; and a load circuit having a first input connected to the low-speed counter output to accept the low-speed counter signals, a second input connected to the high speed counter output to accept the high-speed counter signals, a third input to accept the reference clock signal for synchronizing the high-speed counter signals to the reference clock signal, the load circuit having an output connected to the third input of the high-speed counter to provide the load pulse that is responsive to the low-speed counter signals and synchronized high-speed counter signals.

2. The counter circuit of claim 1 wherein the high-speed counter divides the reference clock signal by an integer value selected from the group of odd and even integers.

3. The counter circuit of claim 1 wherein the high-speed counter divides the reference clock with a selectable first divisor and a fixed second divisor.

4. The counter circuit of claim 3 wherein the high-speed counter divides the reference clock with the selectable first divisor during a first number of division cycles and with the fixed second divisor during a second number of division cycles.

5. The counter circuit of claim 4 wherein the high-speed counter second input accepts first and second divisor commands that select the first divisor and that select first number of division cycles in which the first divisor is used, and the output supplies a first high-speed counter signal and a second high-speed counter signal, delayed with respect to the first high-speed counter signal.

6. The counter circuit of claim 5 wherein the low-speed counter output supplies a first low-speed counter signal and a second low-speed counter signal, delayed with respect to the first low-speed counter signal; and wherein the load circuit has an input to accept the first and second low-speed counter signals, wherein the load circuit input accepts the first and second high-speed counter signals, and wherein the output supplies the load pulse that is responsive to the phases of the combination of high-speed and low-speed counter signals.

7. The counter circuit of claim 5 wherein the high-speed counter includes:

a first multiplexor (MUX) having a first input to accept the first divisor command, a second input to accept the second high-speed counter signal, a selection input to accept the load pulse, and an output to supply the selected input signal;

a first flip-flop having a first input to accept the reference clock signal, a second input connected to the first MUX output, and an output to supply the first high-speed counter signal;

a second MUX having a first input to accept the second divisor command, a second input to accept the first high-speed counter signal, a selection input to accept the load pulse, and an output to supply the selected input signal; and a second flip-flop having a first input to accept the reference clock signal, a second input connected to the second MUX output, and an output to supply the second high-speed counter signal.

8. The counter circuit of claim 7 wherein the load circuit generates the load pulse as an initial condition;

wherein the first and second MUXs respectively output the values of the first and second divisor commands in response to the load pulse;

wherein the first flip-flop is initialized to offset the first high-speed counter signal in response to the first divisor command; and wherein the second flip-flop is initialized to offset the second high-speed counter signal in response to the second divisor command.

9. The counter circuit of claim 8 wherein the high-speed counter first divisor and first number of division cycles are selected in response to initializing the first and second flip-flops; and wherein the high-speed counter divides the reference clock signal with the second divisor, following the first number of division cycles.

10. The counter circuit of claim 9 wherein the first divisor command of "1" is provided and the second divisor command of "0" is provided; and wherein the high-speed counter first divisor is a two.

11. The counter circuit of claim 9 wherein the first divisor command of "0" is provided and the second divisor command of "0" is provided; and wherein the high-speed counter first divisor is a three.

12. The counter circuit of claim 9 wherein the first divisor command of "0" is provided and the second divisor command of "1" is provided; and wherein the high-speed counter first divisor is a four.

13. The counter circuit of claim 9 wherein a first divisor command of "1" is provided and a second divisor command of "1" is provided; and wherein the high-speed counter first divisor is a five.

14. The counter circuit of claim 9 wherein the low-speed counter supplies a low-speed counter signal is a quotient of the high-speed counter signal divided by four;

wherein the high-speed counter performs four division cycles between reinitialization with the load pulse;

wherein the high-speed counter second divisor is four;

wherein the first divisor command of "1" is provided and the second divisor command of "0" is provided;

wherein the high-speed counter selects a first divisor of two, for one division cycle; and wherein the low-speed counter supplies low-speed counter signals that are a quotient of the reference clock divided by 14.

15. The counter circuit of claim 14 wherein the first divisor command of "0" is provided and the second divisor command of "0" is provided;

wherein the high-speed counter selects a first divisor of three, for one division cycle; and wherein the low-speed counter supplies low-speed counter signals that are a quotient of the reference clock signal divided by 15.

16. The counter circuit of claim 15 wherein the first divisor command of "0" is provided and the second divisor command of "1" is provided;

wherein the high-speed counter selects a first divisor of four, for one division cycle; and wherein the low-speed counter supplies low-speed counter signals that are a quotient of the reference clock signal divided by 16.

17. The counter circuit of claim 16 wherein the first divisor command of "1" is provided and the second divisor command of "1" is provided;

wherein the high-speed counter selects a first divisor of five, for one division cycle; and wherein the low-speed counter supplies low-speed counter signals that are a quotient of the reference clock signal divided by 17.

18. A partially-synchronous method for dividing a reference clock with a selectable divisor, the method comprising:

accepting a reference clock signal;

accepting divisor commands;

in response to divisor commands, synchronously dividing the reference clock signal using a first divisor for a first set of division cycles and using a second divisor for a second set of division cycles;

in response to synchronously dividing the reference clock signal, supplying high-speed counter signals;

asynchronously dividing the high-speed counter signals; and in response to asynchronously dividing the high-speed counter signals, supplying low-speed counter signals.

19. The method of claim 18 further comprising:

in response to the high-speed and low-speed counter signals, initializing the high-speed counter signals; and in response to initializing the high-speed counter signals, accepting divisor commands.

20. The method of claim 19 wherein dividing the reference clock signal with the first divisor includes the divisor being an integer value selected from the group of odd and even integers.

21. The method of claim 19 further comprising:

synchronously dividing the reference clock signal with a second divisor.

22. The method of claim 21 wherein supplying low-speed counter signals includes supplying a first low-speed counter signal and a second low-speed counter signal, delayed with respect to the first low-speed counter signal; and wherein initializing the high-speed counter signals includes initializing the high-speed counter signals in response to the first and second low-speed counter signals, first and second high-speed counter signals, and the reference clock signal.

23. The method of claim 22 wherein accepting divisor commands includes accepting a first and second divisor command;

wherein initializing the high-speed counter signals includes initializing the first and second high-speed counter signals, respectively, with the first and second divisor commands; and wherein supplying high-speed counter signals includes offsetting the first and second high-speed counter signals, respectively, in response to first and second divisor commands.

24. The method of claim 23 wherein accepting divisor commands includes accepting the fist divisor command of "1" and the second divisor command of "0"; and wherein selecting a first divisor includes selecting a first divisor of two.

25. The method of claim 24 wherein asynchronously dividing the high-speed counter signals includes dividing with a divisor of four;

wherein dividing the reference clock signal with the first divisor includes dividing for one division cycle;

wherein dividing the reference clock signal with the second divisor includes dividing the reference clock signal with a divisor of four, for three division cycles; and wherein supplying the low-speed counter signals includes supplying a low-speed counter signal that is a quotient of the reference clock signal divided by fourteen.

26. The method of claim 23 accepting divisor commands includes accepting the first divisor command of "0" and the second divisor command of "0"; and wherein selecting a first divisor includes selecting a first divisor of three.

27. The method of claim 26 wherein asynchronously dividing the high-speed counter signals includes dividing with a divisor of four;

wherein dividing the reference clock signal with the first divisor includes dividing for one division cycle;

wherein dividing the reference clock signal with the second divisor includes dividing the reference clock signal with a divisor of four, for three division cycles; and wherein supplying the low-speed counter signals includes supplying a low-speed counter signal that is a quotient of the reference clock signal divided by fifteen.

28. The method of claim 23 wherein accepting divisor commands includes accepting the first divisor command of "0" and the second divisor command of "1" ; and wherein selecting the first divisor includes selecting a first divisor of four.

29. The method of claim 28 wherein asynchronously dividing the high-speed counter signals includes dividing with a divisor of four;

wherein dividing the reference clock signal with the first divisor includes dividing for one division cycle;

wherein dividing the reference clock signal with the second divisor includes dividing the reference clock signal with a divisor of four, for three division cycles; and wherein supplying the low-speed counter signals includes supplying a low-speed counter signal that is a quotient of the reference clock signal divided by sixteen.

30. The method of claim 23 wherein accepting divisor commands includes accepting the first divisor command of "1" and the second divisor command of "1"; and wherein selecting the first divisor includes selecting a first divisor of five.

31. The method of claim 30 wherein asynchronously dividing the high-speed counter signals includes dividing with a divisor of four;

wherein dividing the reference clock signal with the first divisor includes dividing for one division cycle;

wherein dividing the reference clock signal with the second divisor includes dividing the reference clock signal with a divisor of four, for three division cycles; and wherein supplying the low-speed counter signals includes supplying a low-speed counter signal that is a quotient of the reference clock signal divided by seventeen.

* * * * *